(12) United States Patent
Wang et al.

(10) Patent No.: US 8,644,023 B2
(45) Date of Patent: Feb. 4, 2014

(54) HEAT DISSIPATION DEVICE AND ELECTRONIC DEVICE USING THE SAME

(75) Inventors: Shin-Yi Wang, Taipei (TW); Chun-Lung Lin, Taipei (TW)

(73) Assignee: Inventec Corporation, Taipei (TW)

( * ) Notice: Subject to any disclaimer, the term of this patent is extended or adjusted under 35 U.S.C. 154(b) by 286 days.

(21) Appl. No.: 13/198,841

(22) Filed: Aug. 5, 2011

(65) Prior Publication Data

US 2012/0320526 A1 Dec. 20, 2012

(30) Foreign Application Priority Data

Jun. 15, 2011 (TW) .............................. 100120908 A

(51) Int. Cl.
*H05K 7/20* (2006.01)
(52) U.S. Cl.
USPC ............... 361/697; 361/679.49; 361/679.52; 361/695; 361/701; 361/703; 165/80.3; 165/104.33
(58) Field of Classification Search
USPC ................... 361/679.46–679.54, 688–722
See application file for complete search history.

(56) References Cited

U.S. PATENT DOCUMENTS

| 7,589,965 B2 * | 9/2009 | Liang et al. ................... 361/695 |
| 7,710,724 B2 * | 5/2010 | Takeguchi et al. ............. 361/700 |
| 2003/0053296 A1 * | 3/2003 | Tanaka et al. ................. 361/719 |
| 2004/0001316 A1 * | 1/2004 | Kamikawa et al. ............ 361/700 |
| 2006/0181851 A1 * | 8/2006 | Frank et al. ................... 361/700 |
| 2007/0029071 A1 * | 2/2007 | Hwang et al. ............ 165/104.33 |
| 2008/0259565 A1 * | 10/2008 | Iwata et al. ................... 361/697 |
| 2010/0103616 A1 * | 4/2010 | Hwang et al. ................. 361/695 |
| 2010/0246125 A1 * | 9/2010 | Okutsu ......................... 361/695 |
| 2010/0258276 A1 * | 10/2010 | Chen et al. ............... 165/104.26 |

FOREIGN PATENT DOCUMENTS

TW 200538023 11/2005

* cited by examiner

*Primary Examiner* — Courtney Smith
(74) *Attorney, Agent, or Firm* — Morris, Manning & Martin, LLP; Tim Tingkang Xia, Esq.

(57) ABSTRACT

A heat dissipation device is disposed in an electronic device. The electronic device has an opening and an upper wall and a lower wall at the position where the opening is formed. The heat dissipation device includes an air passage and a pair of air deflectors disposed on two opposite sides of the air passage. A distance between the pair of air deflectors is smaller than a distance between the upper wall and the lower wall. The pair of air deflectors is located between the upper wall and the lower wall. The hot air inside the electronic device after passing through the air passage will not be obstructed by a barrier but is directly discharged outside the electronic device through the opening.

9 Claims, 5 Drawing Sheets

HEAT DISSIPATION DEVICE AND ELECTRONIC DEVICE USING THE SAME

CROSS-REFERENCE TO RELATED APPLICATIONS

This non-provisional application claims priority under 35 U.S.C. §119(a) on Patent Application No(s). 100120908 filed in Taiwan, R.O.C. on Jun. 15, 2011, the entire contents of which are hereby incorporated by reference.

BACKGROUND

1. Technical Field

The disclosure relates to a heat dissipation device, and more particularly to a heat dissipation device for an electronic device.

2. Related Art

In recent years, a fan disposed in an electronic device is used for dissipating heat of the electronic device. While being in operation, the fan generates forced convection inside the electronic device for guiding cold air into the electronic device from the outside thereof. The cold air after entering the electronic device exchanges heat with the electronic components inside the electronic device, and then is discharged into the outside via an opening of the electronic device.

However, to enhance the effect of cooling down the electronic components by the cold air entering the electronic device, the electronic device further has heat-dissipation fins in contact with the electronic device. The heat dissipation fin quickly dissipates the heat of the electronic components to the air inside the electronic device. By such heat-dissipation fins, heat of the electronic components transfers to the air inside the electronic device more quickly. Then, via the forced convection generated by the fan, the heated air is quickly discharged into the outside of the electronic device through the opening.

However, during discharging the heated air, because a part of the heated air may be blocked by the housing of the electronic device, and, then, sucked back into the electronic device by the fan, such part of the heated air will be accumulated inside the electronic device and reheat it.

As a result, the temperature inside the electronic device may continuously rise, which may cause crash of the electronic components. Therefore, the inventor recognizes a need of how to effectively discharge the heated air into the outside of the electronic device.

SUMMARY

The disclosure relates to a heat dissipation device and an electronic device using the same, thereby solving the problem of the prior art that the heated air is hard to be effectively discharged into the outside of the electronic device.

An electronic device disclosed in an embodiment comprises a housing, a heat-generating element, a heat dissipation device, and a fan. The housing has an accommodation space and an opening in communication with the accommodation space.

The housing comprises an upper wall and a lower wall at the position where the opening is formed. The heat-generating element is disposed in the accommodation space. The heat dissipation device is disposed in the accommodation space, and the heat dissipation device comprises a first heat dissipation fin, a second heat dissipation fin, and a heat pipe. The second heat dissipation fin comprises a body, a first air deflector, and a second air deflector. The first air deflector and the second air deflector are located between the body and the first heat dissipation fin to form an air passage. The air passage is communicated with the opening. The air passage has an air intake end and an air outlet end opposite to the air intake end. At the air outlet end, a distance between the pair of air deflectors is smaller than a distance between the upper wall and the lower wall, and the pair of air deflectors is sandwiched between the upper wall and the lower wall. The heat pipe is in contact with the heat-generating element, the first heat dissipation fin, and the second heat dissipation fin. The fan is disposed in the accommodation space and located at the air intake end of the air passage for driving an air flow passing through the air passage and discharged via the opening.

A heat dissipation device disclosed in an embodiment an embodiment is applicable to an electronic device. The electronic device comprises a housing having an accommodation space. The housing further has an opening in communication with the accommodation space. The housing comprises an upper wall and a lower wall at the position where the opening is formed. The electronic device comprises a heat-generating element disposed in the accommodation space, and the heat dissipation device comprises a first heat dissipation fin, a second heat dissipation fin, and a heat pipe. The second heat dissipation fin comprises a body, a first air deflector, and a second air deflector. The first air deflector and the second air deflector are located between the body and the first heat dissipation fin to form an air passage. The air passage is communicated with the opening, and the air passage has an air intake end and an air outlet end opposite to the air intake end. At the air outlet end, a distance between the pair of air deflectors is smaller than a distance between the upper wall and the lower wall, and the pair of air deflectors is sandwiched between the upper wall and the lower wall. The heat pipe is in contact with the heat-generating element, the first heat dissipation fin, and the second heat dissipation fin.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
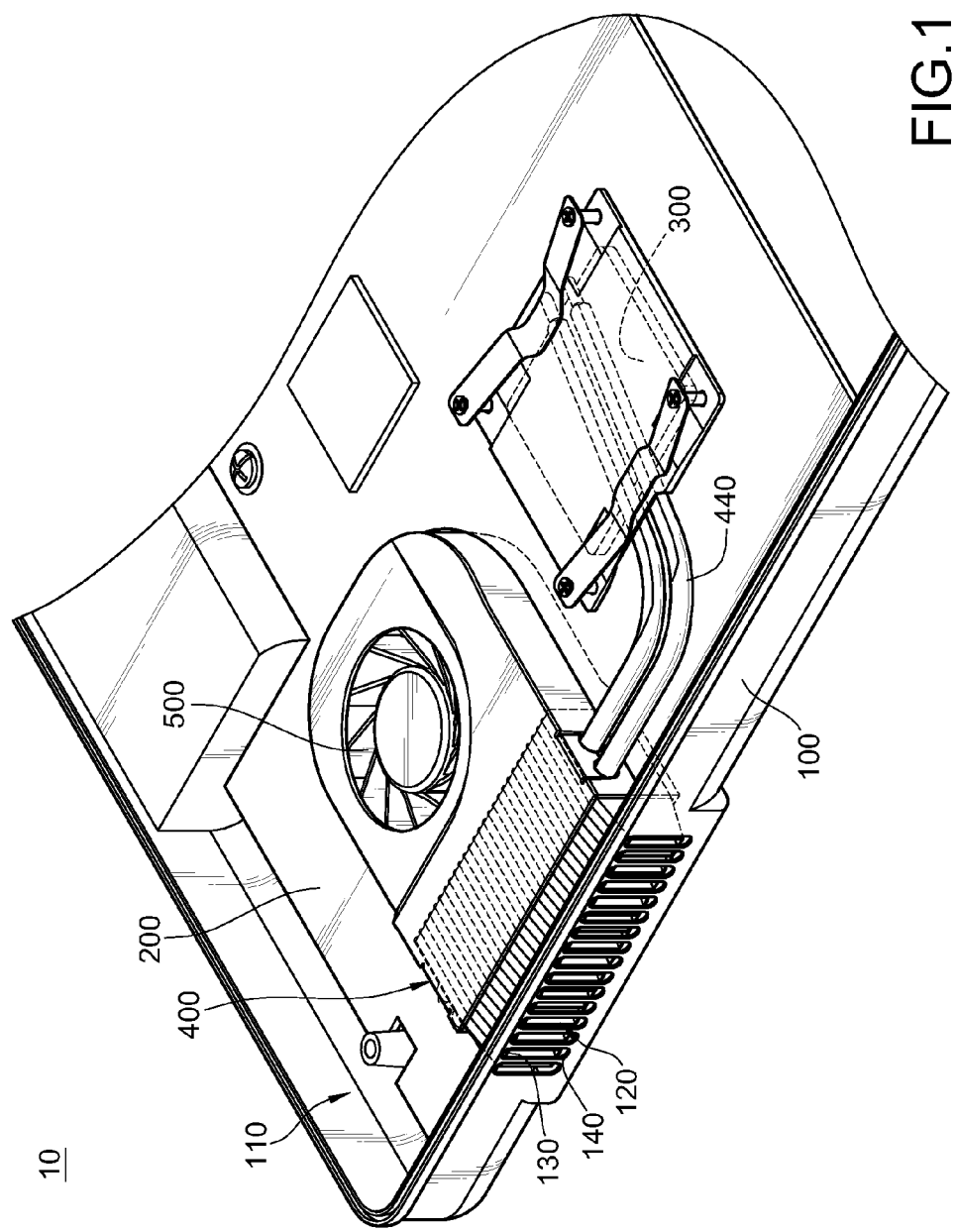
FIG. 1 is a schematic three-dimensional view of an electronic device with a side plate removed according to a first embodiment.
Figure 2:
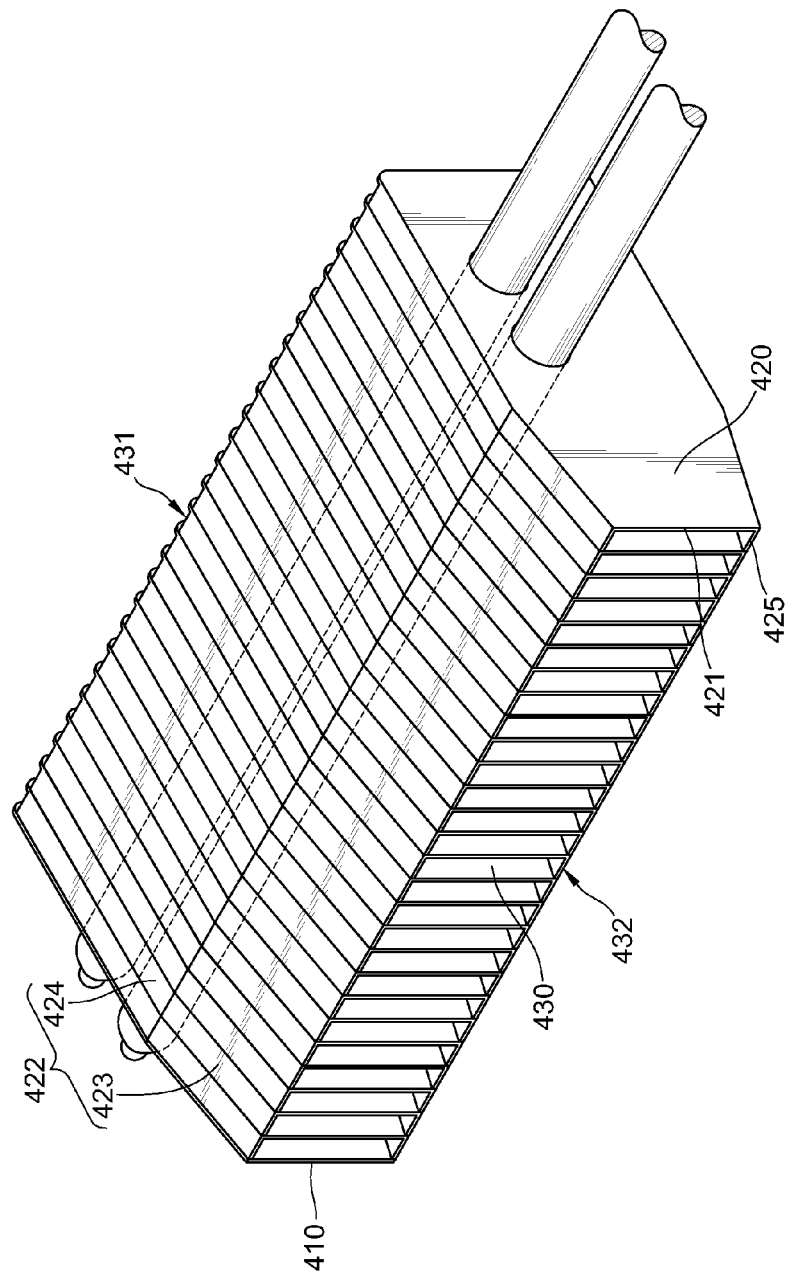
FIG. 2 is a schematic three-dimensional view of a heat dissipation device in FIG. 1.
Figure 3:
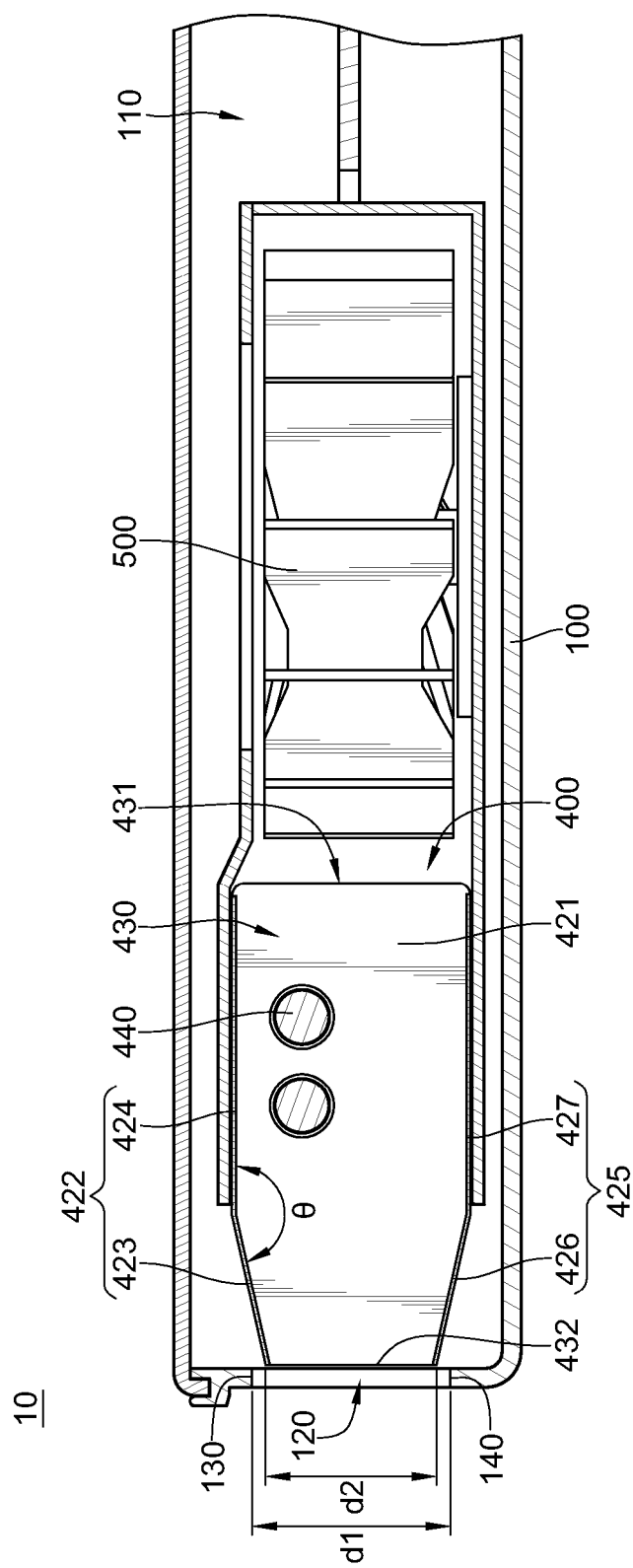
FIG. 3 is a schematic cross-sectional view of FIG. 1.

As shown in FIG. 1 to FIG. 3, an electronic device 10 of this embodiment may be a desktop computer, a notebook computer, or a flat panel computer. In this embodiment, the notebook computer is taken as an example for illustration, but the present invention is not limited thereto.

The electronic device 10 comprises a housing 100, a mainboard 200, a heat-generating element 300, a heat dissipation device 400, and a fan 500. The housing 100 has an accommodation space 110 and an opening 120 in communication with the accommodation space 110. The housing 100 comprises an upper wall 130 and a lower wall 140 at the position where the opening 120 is formed. The upper wall 130 is at a distance d1 from the lower wall 140. The mainboard 200 is disposed in the accommodation space 110. The heat-generating element 300 and the fan 500 are respectively electrically connected to the mainboard 200.

The heat dissipation device 400 of this embodiment is disposed in the accommodation space 110, and the heat dissipation device 400 comprises a first heat dissipation fin 410, a second heat dissipation fin 420, and a heat pipe 440.

The second heat dissipation fin 420 comprises a body 421, a first air deflector 422, and a second air deflector 425. The first air deflector 422 and the second air deflector 425 protrude from two opposite sides of the body 421 towards the first heat dissipation fin 410. In other words, the first air deflector 422 and the second air deflector 425 are located between the body 421 and the first heat dissipation fin 410, and the first air deflector 422, the second air deflector 425, the body 421, and the first heat dissipation fin 410 altogether form an air passage 430 communicated with the opening 120.

The air passage 430 has an air intake end 431 and an air outlet end 432 opposite to the air intake end 431. At the air outlet end 432, a distance d2 between the first air deflector 422 and the second air deflector 425 is smaller than the distance d1 between the upper wall 130 and the lower wall 140, and the first air deflector 422 and the second air deflector 425 are sandwiched between the upper wall 130 and the lower wall 140. In other words, the passage size at the air outlet end 432 of the air passage 430 is smaller than the size of the opening 120, and the air outlet end 432 of the air passage 430 is aligned with the opening 120, so that the housing 100 may not cover the air passage 430.

The heat pipe 440 is in contact with the heat-generating element 300, the first heat dissipation fin 410, and the second heat dissipation fin 420 for conducting the heat of the heat-generating element 300 to the first heat dissipation fin 410 and the second heat dissipation fin 420 through the heat pipe 440.

Then, the structures of the first air deflector 422 and the second air deflector 425 are illustrated. The first air deflector 422 comprises a first plate 423 and a second plate 424. The second air deflector 425 comprises a first plate 426 and a second plate 427. The two first plates 423, 426 are respectively connected to the two second plates 424, 427. The two first plates 423, 426 are disposed on the air outlet end 432 of the first air deflector 422 and the second air deflector 425, and the two second plates 424, 427 are disposed on the air intake end 431 of the first air deflector 422 and the second air deflector 425. Inclined angles θ are respectively formed between the first plates 423 and the second plate 424 and between the first plate 426 and the second plates 427 and in a range from 90° to 180°.

In other words, the distance between the first plates 423 and 426 taper toward the air outlet end 432. The two first plates 423, 426 and the two second plates 424, 427 each are flat plates.

Therefore, the distance d2 at the air outlet end 432 of the air passage 430 between the two second plates 424, 427 is minimal, and smaller than the distance d1 between the upper wall 130 and the lower wall 140, and tail ends of the two second plates 424, 427 are sandwiched between the upper wall 130 and the lower wall 140.

In some embodiments, to increase the surface area of heat dissipation of the heat dissipation device 400, more than one second heat dissipation fin 420 are arranged in parallel to form a plurality of air passages 440.

In addition, the method for making the minimal distance d2 between the two second plates 424, 427 smaller than the distance between the upper wall 130 and the lower wall 140 is not limited to the above method. In a second embodiment similar to the first embodiment, another method is illustrated and only the difference between the first embodiment and the second embodiment is mentioned.

Figure 4:
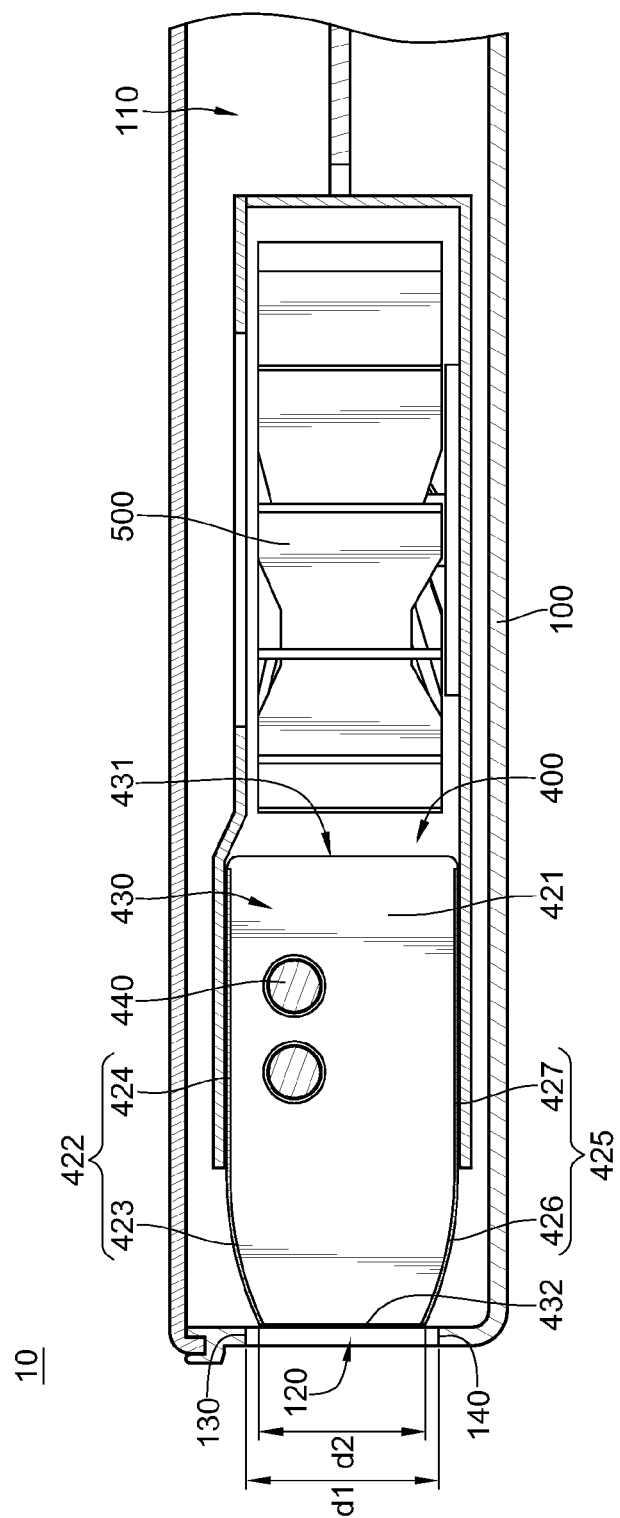
FIG. 4 is a schematic three-dimensional view of an electronic device with a side plate removed according to a second embodiment.

As shown in FIG. 4, the heat dissipation device 400 of this embodiment is disposed in the accommodation space 110, and the heat dissipation device 400 comprises a first heat dissipation fin 410, a second heat dissipation fin 420, and a heat pipe 440.

The second heat dissipation fin 420 comprises a body 421, a first air deflector 422, and a second air deflector 425. The first air deflector 422 and the second air deflector 425 are located between the body 421 and the first heat dissipation fin 410 to form an air passage 430.

The air passage 430 has an air intake end 431 and an air outlet end 432 opposite to the air intake end 431. The heat pipe 440 is in contact with the heat-generating element 300, the first heat dissipation fin 410, and the second heat dissipation fin 420 for conducting the heat of the heat-generating element 300 to the first heat dissipation fin 410 and the second heat dissipation fin 420 through the heat pipe 440.

Then, the structures of the first air deflector 422 and the second air deflector 425 are illustrated. The first air deflector 422 of this embodiment comprises a first plate 423 and a second plate 424. The second air deflector 425 comprises a first plate 426 and a second plate 427. The two first plates 423, 426 are respectively connected to the two second plates 424, 427. The two first plates 423, 426 are disposed at the air intake end 431 of the first air deflector 422 and the second air deflector 425, and the two second plates 424, 427 are disposed at the air outlet end 432 of the first air deflector 422 and the second air deflector 425. Each of the second plates 424, 427 respectively has a bend. In other words, the second plate 424 of the first air deflector 422 is bent towards the second plate 427 of the second air deflector 425, and the second plate 427 of the second air deflector 425 is bent towards the second plate 424 of the first air deflector 422.

Therefore, the distance d2 between the two second plates 424, 427 at the air outlet end 432 of the air passage 430 is minimal. The minimal distance d2 between the two second plates 424, 427 is smaller than the distance d1 between the upper wall 130 and the lower wall 140, and the tail ends of the two second plates 424, 427 are sandwiched between the upper wall 130 and the lower wall 140.

Figure 5:
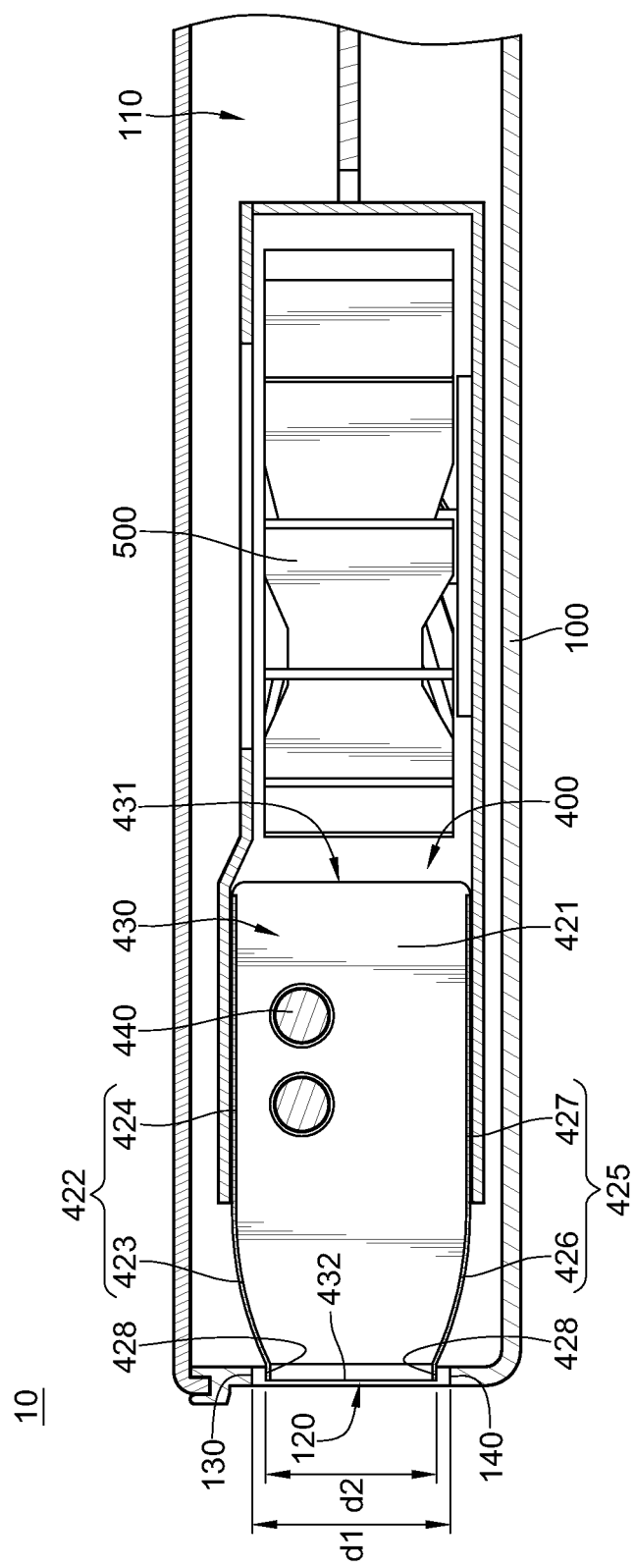
FIG. 5 is a schematic three-dimensional view of an electronic device with a side plate removed according to a third embodiment.

In a third embodiment, further another method of making the minimal distance d2 between the two second plates 424, 427 smaller than the distance between the upper wall 130 and the lower wall 140 is illustrated. As shown in FIG. 5, the heat dissipation device 400 of this embodiment is disposed in the accommodation space 110, and comprises a first heat dissipation fin 410, a second heat dissipation fin 420, and a heat pipe 440.

The second heat dissipation fin 420 comprises a body 421, a first air deflector 422, and a second air deflector 425. The first air deflector 422 and the second air deflector 425 are located between the body 421 and the first heat dissipation fin 410 to form an air passage 430.

The air passage 430 has an air intake end 431 and an air outlet end 432 opposite to the air intake end 431. The heat pipe 440 is in contact with the heat-generating element 300, the first heat dissipation fin 410, and the second heat dissipation fin 420 for conducting the heat of the heat-generating element 300 to the first heat dissipation fin 410 and the second heat dissipation fin 420 through the heat pipe 440.

Then, the structures of the first air deflector 422 and the second air deflector 425 are illustrated. The first air deflector 422 of this embodiment comprises a first plate 423 and a second plate 424, and the second air deflector 425 comprises a first plate 426 and a second plate 427. The two first plates 423, 426 are respectively connected to the two second plates 424, 427. The two first plates 423, 426 are disposed on the air outlet end 432 of the first air deflector 422 and the second air deflector 425, and the two second plates 424, 427 are disposed on the air intake end 431 of the first air deflector 422 and the second air deflector 425.

The second heat dissipation fin further comprises a pair of extending sections 428. The pair of extending sections 428 is respectively connected to the two first plates 423, 426, and respectively extends in a direction from the two first plates 423, 426 towards the opening 120. The pair of extending sections 428 is located between the upper wall 130 and the lower wall 140 of the opening 120.

The distance d2 between the pair of extending sections 428 is smaller than the distance d1 between the upper wall 130 and the lower wall 140, and the tail ends of the pair of extending sections 428, i.e. the pair of the extending sections, are sandwiched between the upper wall 130 and the lower wall 140.

According to the heat dissipation device and the electronic device using the same disclosed in the above embodiments, the distance between the first air deflector and the second air deflector disposed at the air outlet end is made smaller than the distance between the upper wall and the lower wall of the opening. Therefore, the size of the air passage is smaller than the size of the opening. Besides, the air outlet end of the air passage is aligned with the opening to avoid being blocked of the housing. In this manner, after the air passes through the air passage, the air directly blows outside the electronic device via the opening, and may not be blocked by the housing of the electronic device and sucked backed into the electronic device. As such, when the air exchanges heat with the thermal energy generated by the heat-generating element and becomes hot air, the hot air may be discharged outside the electronic device through the air passage, thereby the temperature inside the electronic device is reduced.

What is claimed is:

1. An electronic device, comprising:
a housing, having an accommodation space and an opening through the accommodation space, and having an upper wall and a lower wall at the position where the opening is formed;
a heat-generating element, disposed in the accommodation space;
a heat dissipation device, disposed in the accommodation space, comprising:
a first heat dissipation fin;
a second heat dissipation fin, comprising a body, a first air deflector, a second air deflector, and a pair of extending sections, wherein the first air deflector and the second air deflector are located between the body and the first heat dissipation fin to form an air passage, the air passage is communicated with the opening, the air passage has an air intake end and an air outlet end opposite to the air intake end, a distance between the first air deflector and the second air deflector at the air outlet end of the second heat dissipation fin is smaller than a distance between the upper wall and the lower wall, the first air deflector and the second air deflector are located between the upper wall and the lower wall, and the pair of extending sections extends in a direction from the air outlet end of the first air deflector and the second air deflector towards the opening, so that the pair of extending sections of the second heat dissipation fin are disposed in the opening and are sandwiched between the upper wall and the lower wall; and
a heat pipe, in contact with the heat-generating element, the first heat dissipation fin, and the second heat dissipation fin; and
a fan, disposed in the accommodation space and located on the air intake end of the air passage for driving an air flow passing through the air passage and discharged via the opening.

2. The electronic device according to claim 1, wherein the first air deflector and the second air deflector respectively comprise a first plate disposed on the air intake end and a second plate disposed on the air outlet end, an inclined angle is formed between the second plate and the first plate, so that a tail end of the second plate of the first air deflector tilts towards the second plate of the second air deflector, a minimal distance between the pair of second plates is arranged at the air outlet end of the air passage, and the minimal distance between the pair of second plates is smaller than the distance between the upper wall and the lower wall, and the tail ends of the pair of second plates are sandwiched between the upper wall and the lower wall.

3. The electronic device according to claim 2, wherein the first plates and the second plates are flat plates.

4. The electronic device according to claim 1, wherein each air deflector comprises a first plate disposed at the air intake end and a second plate disposed at the air outlet end, the second plate has a bend towards one side of the air passage, the minimal distance between the pair of second plates is smaller than the distance between the upper wall and the lower wall, and the tail ends of the pair of second plates are sandwiched between the upper wall and the lower wall.

5. The electronic device according to claim 1, further comprising a mainboard disposed in the accommodation space, wherein the heat-generating element is electrically connected to the mainboard, and the fan device is electrically connected to the mainboard.

6. A heat dissipation device, for being assembled in an electronic device, wherein the electronic device comprises a housing having an accommodation space, the housing further has an opening through the accommodation space and an upper wall and a lower wall at the position where the opening is formed, and the electronic device comprises a heat-generating element disposed in the accommodation space, the heat dissipation device comprising:
a first heat dissipation fin;
a second heat dissipation fin, comprising a body, a first air deflector, a second air deflector, and a pair of extending sections, wherein the first air deflector and the second air deflector are located between the body and the first heat dissipation fin to form a air passage, the air passage is communicated with the opening, the air passage has an air intake end and an air outlet end opposite to the air intake end, a distance between the pair of air deflectors located on the air outlet end of the first heat dissipation fin is smaller than a distance between the upper wall and the lower wall, the pair of air deflectors are sandwiched between the upper wall and the lower wall, and the pair of extending sections respectively extend in a direction from the air outlet end of the first air deflector and the second air deflector towards the opening, so that the pair of extending sections of the second heat dissipation fin are disposed in the opening and are sandwiched between the upper wall and the lower wall; and a heat pipe, in contact with the heat-generating element, the first heat dissipation fin, and the second heat dissipation fin.

7. The heat dissipation device according to claim 6, wherein the first air deflector and the second air deflector respectively comprise a first plate disposed on the air intake end and a second plate disposed on the air outlet end, an inclined angle is formed between the second plate and the first plate, so that a tail end of the second plate of the first air deflector tilts towards the second plate of the second air deflector, a minimal distance between the pair of second plates is arranged at the air outlet end of the air passage, and the minimal distance between the pair of second plates is smaller than the distance between the upper wall and the lower wall, and the tail ends of the pair of second plates are sandwiched between the upper wall and the lower wall.

8. The heat dissipation device according to claim 7, wherein the first plate and the second plate are flat plates.

9. The heat dissipation device according to claim 6, wherein each air deflector comprises a first plate disposed on the air intake end and a second plate disposed on the air outlet end, the second plate has a bend towards one side of the air passage, the minimal distance between the pair of second plates is smaller than the distance between the upper wall and the lower wall, and the tail ends of the pair of second plates are sandwiched between the upper wall and the lower wall.

* * * * *